US009651994B1

United States Patent
Yang et al.

(10) Patent No.: US 9,651,994 B1
(45) Date of Patent: May 16, 2017

(54) DOCKING STATION WITH ANTI-THEFT MECHANISM FOR PORTABLE ELECTRONIC DEVICE

(71) Applicant: INFINIWING, INC., San Jose, CA (US)

(72) Inventors: Yi Jang Yang, Taipei (TW); Cheng-Hsiu Chen, Taipei (TW)

(73) Assignee: INFINIWING, INC., San Jose, CA (US)

( * ) Notice: Subject to any disclaimer, the term of this patent is extended or adjusted under 35 U.S.C. 154(b) by 0 days.

(21) Appl. No.: 15/203,837

(22) Filed: Jul. 7, 2016

(30) Foreign Application Priority Data

Feb. 2, 2016 (TW) .............................. 105201672 U

(51) Int. Cl.
| | |
|---|---|
| *G06F 1/16* | (2006.01) |
| *G06F 13/00* | (2006.01) |
| *H05K 5/02* | (2006.01) |
| *E05B 73/00* | (2006.01) |

(52) U.S. Cl.
CPC ........ *G06F 1/1632* (2013.01); *E05B 73/0082* (2013.01); *H05K 5/0208* (2013.01)

(58) Field of Classification Search
CPC ........................... G06F 1/1632; E05B 73/0082
USPC ..... 361/679.4–679.45, 679.57; 710/303, 304
See application file for complete search history.

(56) References Cited

U.S. PATENT DOCUMENTS

| | | | | | |
|---|---|---|---|---|---|
| 6,309,230 | B2* | 10/2001 | Helot | .................... | G06F 1/1632 361/679.43 |
| 6,585,212 | B2* | 7/2003 | Carnevali | ............... | B60R 11/02 248/316.4 |
| 7,032,872 | B2* | 4/2006 | Sullivan | .................. | F16M 11/22 248/346.06 |
| 7,866,623 | B2* | 1/2011 | Lampman | ............... | A47F 7/024 248/186.2 |
| 2003/0164010 | A1* | 9/2003 | Galant | ................ | E05B 73/0082 70/58 |
| 2009/0231793 | A1* | 9/2009 | Chiu | ..................... | H05K 5/0247 361/679.08 |
| 2010/0195279 | A1* | 8/2010 | Michael | ................ | G06F 1/1632 361/679.41 |
| 2011/0080137 | A1* | 4/2011 | Avganim | ............ | E05B 73/0082 320/115 |
| 2012/0127651 | A1* | 5/2012 | Kwon | ..................... | G06F 21/88 361/679.43 |

(Continued)

*Primary Examiner* — Nidhi Thaker
(74) *Attorney, Agent, or Firm* — Bacon & Thomas, PLLC

(57) ABSTRACT

The present invention is to provide a docking station applicable to a portable electronic device and having an anti-theft mechanism, which includes a positioning base having a top side concavely provided with a positioning space and a first abutting surface provided adjacent to one end of the positioning base and facing the positioning space; a sliding base movably connected to an opposite end of the positioning base and provided with a second abutting surface facing the positioning space, wherein the first and second abutting surfaces are respectively and protrudingly provided with a first plug and a second plug configured to be inserted into and thereby connected with corresponding sockets of the portable electronic device; a first fastener and a second fastener respectively provided at the sliding base and the positioning base and capable of being fastened together to prevent the sliding base from moving with respect to the positioning base.

12 Claims, 8 Drawing Sheets

(56) References Cited

U.S. PATENT DOCUMENTS

2013/0148289 A1\* 6/2013 Kwon ................... G06F 1/1632
   361/679.43
2015/0186685 A1\* 7/2015 Vroom ................... G06F 1/1632
   726/35

\* cited by examiner

DOCKING STATION WITH ANTI-THEFT MECHANISM FOR PORTABLE ELECTRONIC DEVICE

FIELD OF THE INVENTION

The present invention relates to a docking station, more particularly to a docking station applicable to a portable electronic device and having an anti-theft mechanism, which includes a positioning base having a top side concavely provided with a positioning space and a first abutting surface provided adjacent to one end of the positioning base and facing the positioning space; a sliding base movably connected to an opposite end of the positioning base and provided with a second abutting surface facing the positioning space, wherein the first and second abutting surfaces are respectively and protrudingly provided with a first plug and a second plug configured to be inserted into and thereby connected with corresponding sockets of the portable electronic device; a first fastener and a second fastener respectively provided at the sliding base and the positioning base and capable of being fastened together to prevent the sliding base from moving with respect to the positioning base and thereby ensure that the portable electronic device is safe from theft.

BACKGROUND OF THE INVENTION

For the last two decades, continual advancements in electronic technology and network communication technology have not only enhanced the various functions of desktop personal computers over and over again, but also made such computers increasingly light and compact to meet consumers' demand for portability. As a result, ultra-thin portable electronic devices (e.g., laptop computers, tablet computers, and smartphones) came into existence, and the gap of functionality between these devices and their desktop counterparts is closing. Some portable electronic devices have even superseded desktop personal computers and become indispensable tools in life and at work.

The trend toward lightweight and compactness, however, leads to substantial limitations on the expandability of portable electronic devices. In order to provide portable electronic device users with more expanded functions (e.g., the function of an external power interface card, a network cable, a mouse, an external keyboard, an external display, a projector, or a printer), docking stations were developed. FIG. 1, for example, shows a docking station designed specifically for a laptop computer 10. The docking station includes a positioning base 11 and a sliding base 12. The bottom side of the positioning base 11 is configured to lie flat on a flat surface. The top side of the positioning base 11 is concavely provided with a positioning space 110, in which a portion of the bottom side of the laptop computer 10 that is adjacent to the rear edge of the laptop computer 10 can be positioned. (To facilitate identification of the configuration of the positioning base 11, two reference numerals 11 are used in FIG. 1 to indicate respectively the exposed part of the positioning base 11 and the part of the positioning base 11 that is covered by the laptop computer 10.) The rear side of the positioning base 11 is provided with a plurality of expansion slots (not shown) for connecting with various peripherals (e.g., a display, a projector, and a printer) respectively. A portion of the positioning base 11 that is adjacent to one end of the positioning base 11 and faces the positioning space 110 is provided with a first abutting surface 112. The first abutting surface 112 is protrudingly provided with a signal plug (e.g., a USB plug, not shown) extending toward the positioning space 110. The signal plug is electrically connected with each of the expansion slots so that, when the laptop computer 10 is positioned in the positioning space 110 and has one of its two corresponding lateral sides abutting against the first abutting surface 112, the signal plug is inserted into and thereby connected with a signal socket in the lateral side of the laptop computer 10, allowing the laptop computer 10 to electrically connect with and transmit signals to and from each peripheral through the signal plug and the corresponding expansion slot. The sliding base 12 is connected to the opposite end of the positioning base 11 and can be moved with respect to the positioning base 11. A portion of the sliding base 12 that faces the positioning space 110 is provided with a second abutting surface 122. The second abutting surface 122 corresponds to the first abutting surface 112 and is protrudingly provided with a power plug (not shown) extending toward the positioning space 110. The power plug is electrically connected with a power supply (e.g., a rectifier). When the laptop computer 10 is positioned in the positioning space 110 and has the opposite lateral side abutting against the second abutting surface 122, the power plug is inserted into and thereby connected with a power socket in this lateral side of the laptop computer 10 in order for the laptop computer 10 to receive electricity from the power supply through the power plug.

Indeed, the docking station increases the expanded functions of the laptop computer 10 by allowing the laptop computer 10 to connect through the docking station to different peripherals. However, the docking station is devoid of any anti-theft mechanism, and it is not uncommon that one who has finished using a certain expanded function of the laptop computer 10 (e.g., printing, preparing a presentation, or searching for information online) fails to put the laptop computer 10 away immediately because he or she is otherwise engaged (e.g., chatting with someone, discussing the contents of the presentation with someone, searching for more information online, or using the toilet). When it subsequently occurs to the user that the laptop computer 10 has been left as is, chances are the laptop computer 10, which is light and compact, is already gone. Should this happen, not only is it extremely difficult, if not impossible, to recover the laptop computer 10, but also the personal files and confidential information stored in the laptop computer 10 are prone to unauthorized access or release, an infuriating occurrence that may cause a huge loss to the user.

Hence, the issue to be addressed by the present invention is to design a docking station with an anti-theft mechanism for a portable electronic device. It is desirable that a docking station can be brought into a locked state to prevent a portable electronic device from being detached therefrom and thereby ensure that the portable electronic device is safe from theft.

BRIEF SUMMARY OF THE INVENTION

It is an objective of the present invention to provide a docking station which is applicable to a portable electronic device (e.g., a laptop computer or a tablet computer) and which has an anti-theft mechanism. The docking station includes a positioning base, a sliding base, a first fastener, and a second fastener. The positioning base has a bottom side and a top side, the former of which is configured to be placed flat on a flat surface while the latter of which is concavely provided with a positioning space. A portion of the bottom side of the portable electronic device that is adjacent to the rear edge of the portable electronic device can be positioned in the positioning space. The positioning base further has a rear side provided with a plurality of expansion interfaces (e.g., expansion slots or expansion plugs) each configured to connect with a different peripheral (e.g., a display, a projector, or a printer). A portion of the positioning base that is adjacent to one end of the positioning base and faces the positioning space is provided with a first abutting surface. The first abutting surface is protrudingly provided with a first plug extending toward the positioning space. The sliding base is connected to the opposite end of the positioning base and can be moved with respect to the positioning base. A portion of the sliding base that faces the positioning space is provided with a second abutting surface. The second abutting surface corresponds to the first abutting surface and is protrudingly provided with a second plug extending toward the positioning space. The first plug and the second plug are configured to be inserted into and thereby connected with corresponding sockets of the portable electronic device respectively. The first fastener is provided at the rear side of the sliding base while the second fastener is pivotally provided at the rear side of the positioning base. When the first abutting surface and the second abutting surface abut against two corresponding lateral sides of the portable electronic device respectively, the second fastener can fasten with the first fastener so that a locking element can lock the two fasteners together to prevent the sliding base from moving with respect to the positioning base.

When the first abutting surface and the second abutting surface abut against the two corresponding lateral sides of the portable electronic device respectively, the docking station can transmit data or power signals to and from the portable electronic device through the plugs, and once the first and the second fasteners are fastened together and locked with the locking element, the portable electronic device is in a locked state, in which the sliding base is immovable with respect to the positioning base and thus keeps the portable electronic device from being detached from the docking station. The docking station, therefore, effectively prevents the portable electronic device from theft.

BRIEF DESCRIPTION OF THE SEVERAL VIEWS OF THE DRAWINGS

The technical features, method of use, and underlying principles of the present invention will be best understood by referring to the following detailed description of some illustrative embodiments in conjunction with the accompanying drawings, in which.

DETAILED DESCRIPTION OF THE INVENTION

Figure 1:
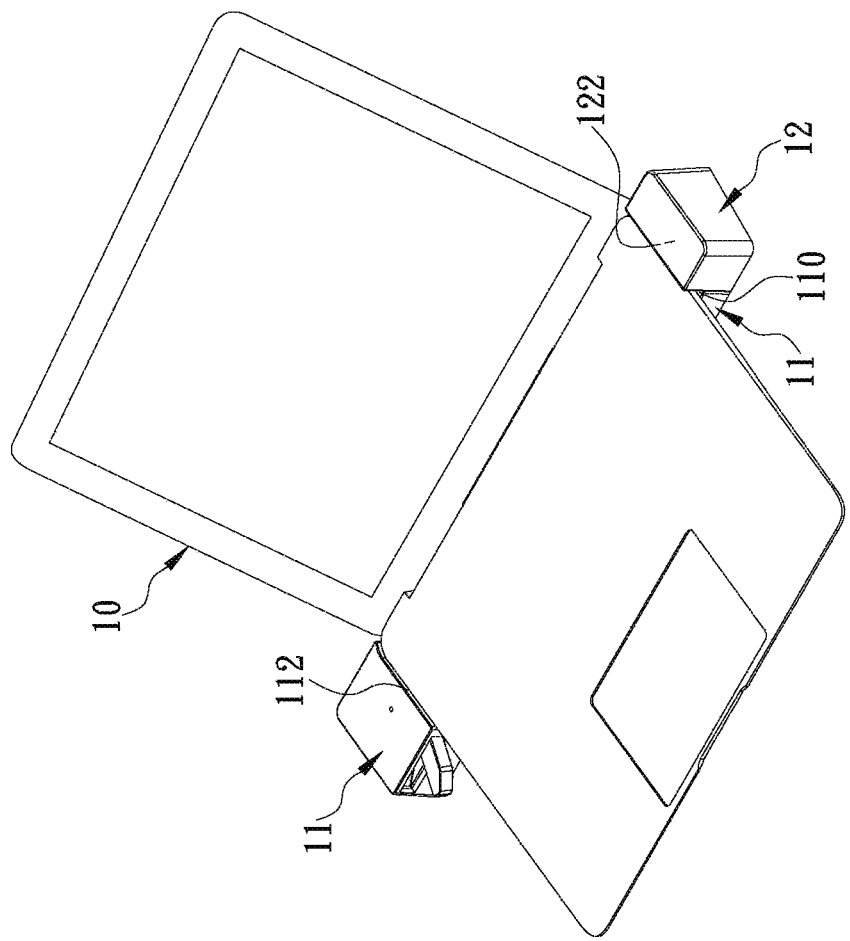
FIG. 1 shows a conventional docking station and a laptop computer in an assembled state.
Figure 2:
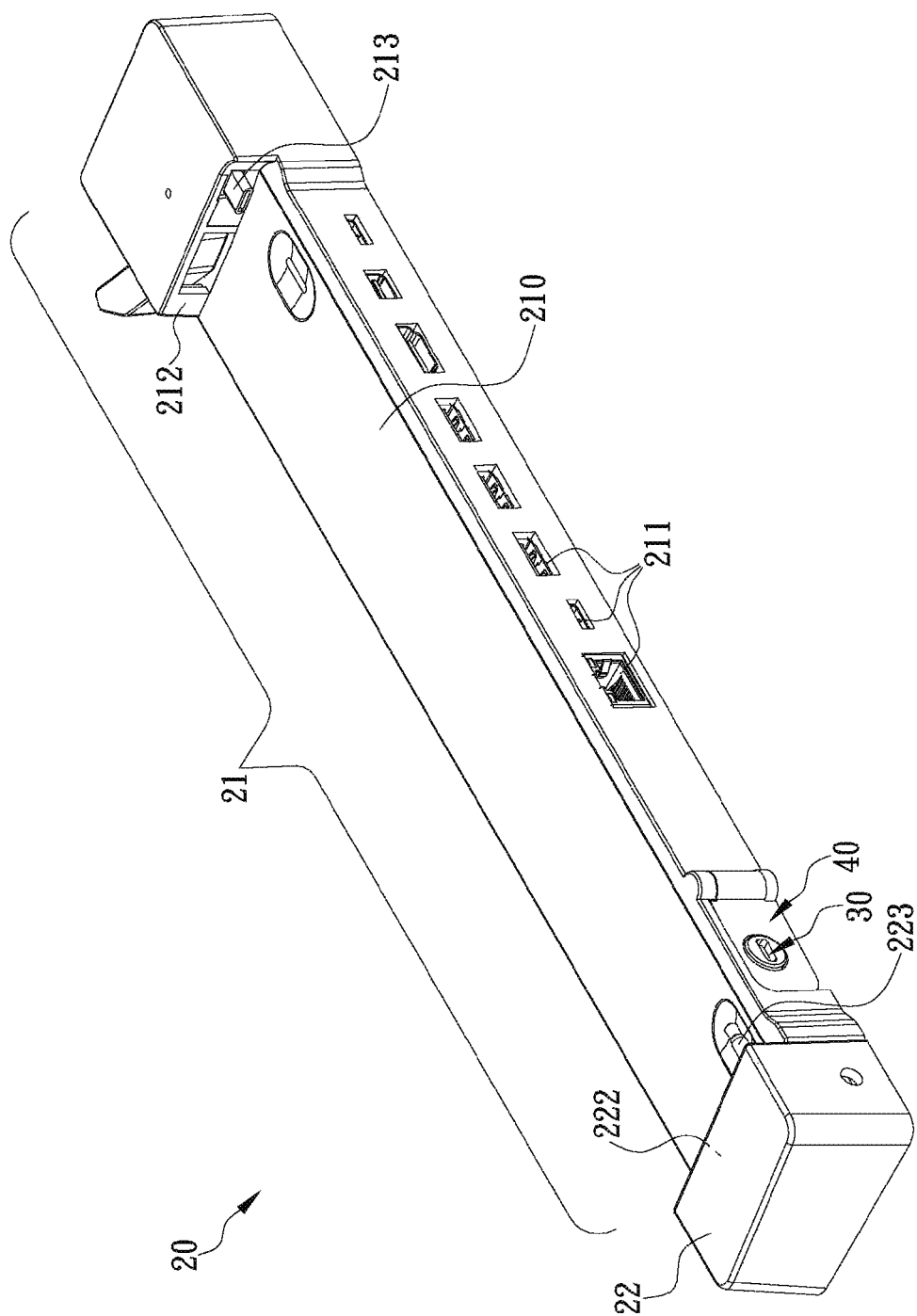
FIG. 2 is a rear perspective view of the docking station in the first preferred embodiment of the present invention.

The present invention provides a docking station applicable to a portable electronic device and having an anti-theft mechanism, wherein the portable electronic device can be a laptop computer, a tablet computer, a smartphone, or the like. To facilitate description, the docking station has a front side and a rear side defined with reference to FIG. 2~FIG. 8: the front side of the docking station is the side facing the upper left corner of each drawing, and the rear side is the side facing the lower right corner of each drawing. Referring to FIG. 2, the docking station 20 in the first preferred embodiment of the present invention includes a positioning base 21, a sliding base 22, a first fastener 30, and a second fastener 40. The positioning base 21 has a bottom side configured to lie flat on a flat surface. The positioning base 21 further has a top side concavely provided with a positioning space 210, and a portion of the bottom side of the portable electronic device that is adjacent to the rear edge of the portable electronic device can be positioned in the positioning space 210. Also, the positioning base 21 has a rear side provided with a plurality of expansion interfaces (e.g., expansion slots or expansion plugs) 211, and each expansion interface 211 is configured to connect with a different peripheral (e.g., a display a projector, or a printer). A portion of the positioning base 21 that is adjacent to one end of the positioning base 21 and faces the positioning space 210 is provided with a first abutting surface 212. The first abutting surface 212 is protrudingly provided with at least one first plug extending toward the positioning space 210. The first plug is shown herein as a signal plug 213 (e.g., a plug complying with the USB Type C specification and configured to transmit signals or, if so designed, both signals and power) by way of example. The signal plug 213 is electrically connected to each expansion interface 211. When the portable electronic device is positioned in the positioning space 210 and has one of its two corresponding lateral sides abutting against the first abutting surface 212, the signal plug 213 is inserted into and thereby connected with a corresponding signal socket in the lateral side of the portable electronic device in order for the portable electronic device to electrically connect with and transmit signals to and from each peripheral through the signal plug 213 and the corresponding expansion interface 211.

The sliding base 22 is connected to the opposite end (hereinafter referred to as the second end) of the positioning base 21 and can be moved with respect to the positioning base 21. A portion of the sliding base 22 that faces the positioning space 210 is provided with a second abutting surface 222. The second abutting surface 222 corresponds to the first abutting surface 212 and is protrudingly provided with a second plug extending toward the positioning space 210. The second plug is shown herein as an audio plug 223 by way of example and is electrically connected to a loudspeaker in the docking station 20. When the portable electronic device is positioned in the positioning space 210 and has the other of its two corresponding lateral sides abutting against the second abutting surface 222, the audio plug 223 is inserted into and thereby connected with a corresponding audio socket in this lateral side of the portable electronic device.

It is worth mentioning that the first plug and the second plug on the docking station 20 are not necessarily "a signal plug and an audio plug"; they can be designed as "a power plug and a signal plug" instead as needed. When the first or the second plug is a power plug, the portable electronic device can receive electricity from a power supply (e.g., a rectifier) in the docking station 20 through the power plug, or a battery in the docking station 20 can receive electricity from the portable electronic device through the power plug. The first or the second plug may also be designed as a no-signal plug, i.e., a plug that is not electrically connected with any of the expansion interfaces 211 and serves only as an engaging means for securing the portable electronic device to the positioning base 21. In that case, the no-signal plug can simulate a USB Type C plug in form in order to engage with a corresponding socket.

Figure 3:
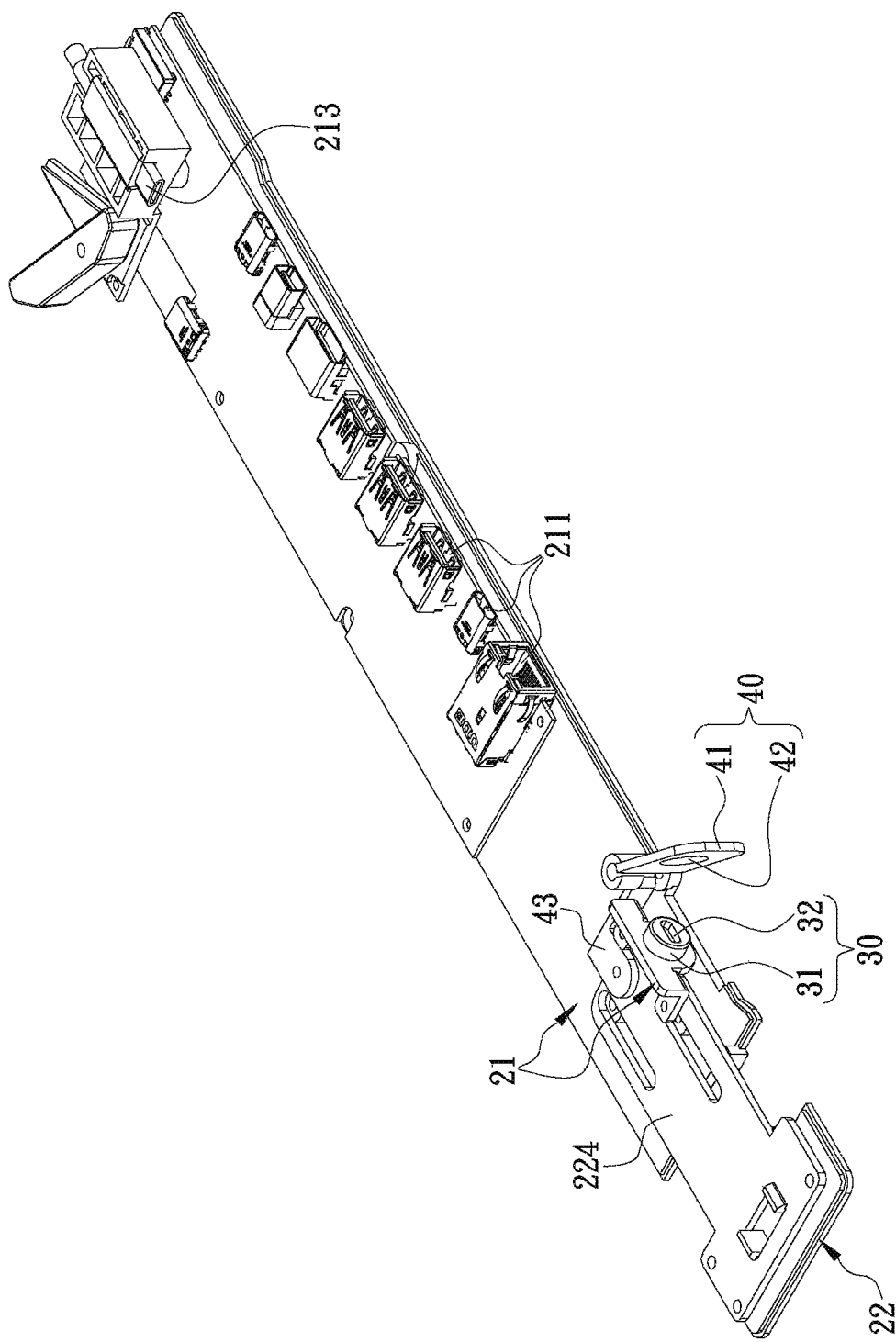
FIG. 3 shows the internal structure of the docking station in the first preferred embodiment.
Figure 4:
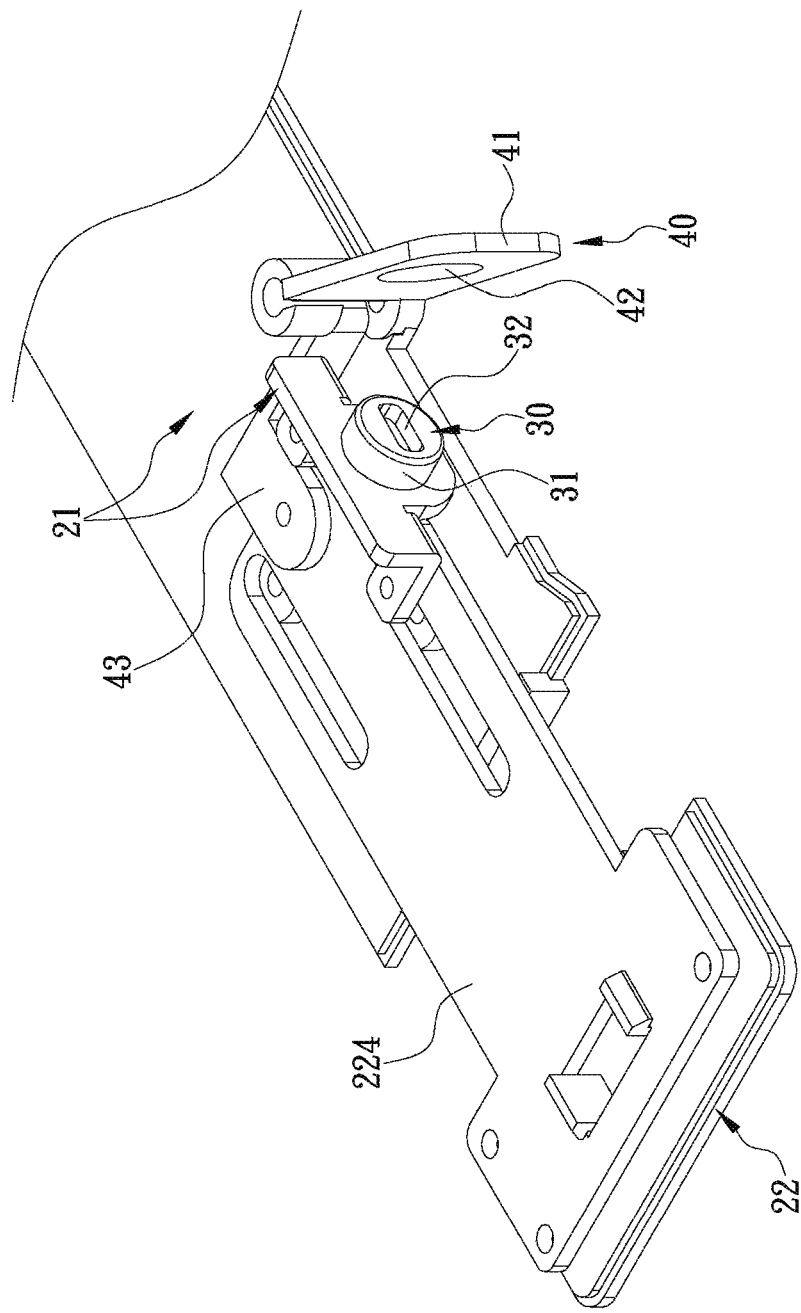
FIG. 4 shows the first fastener and the second fastener of the docking station in the first preferred embodiment, wherein the fasteners have yet to be fastened together.

In the first preferred embodiment, referring to FIG. 2, FIG. 3, and FIG. 4, the first fastener 30 is fixed at the positioning base 21 and is exposed at the rear side of the positioning base 21. The second fastener 40, on the other hand, is pivotally provided at one end of the sliding base 22 and at the rear side of the positioning base 21. When the first abutting surface 212 and the second abutting surface 222 abut against the two corresponding lateral sides of the portable electronic device respectively, the second fastener 40 can fasten with the first fastener 30, as shown in FIG. 5, and then a locking element 50 can be used to lock the two fasteners together, thereby keeping the sliding base 22 from moving with respect to the positioning base 21.

Figure 5:
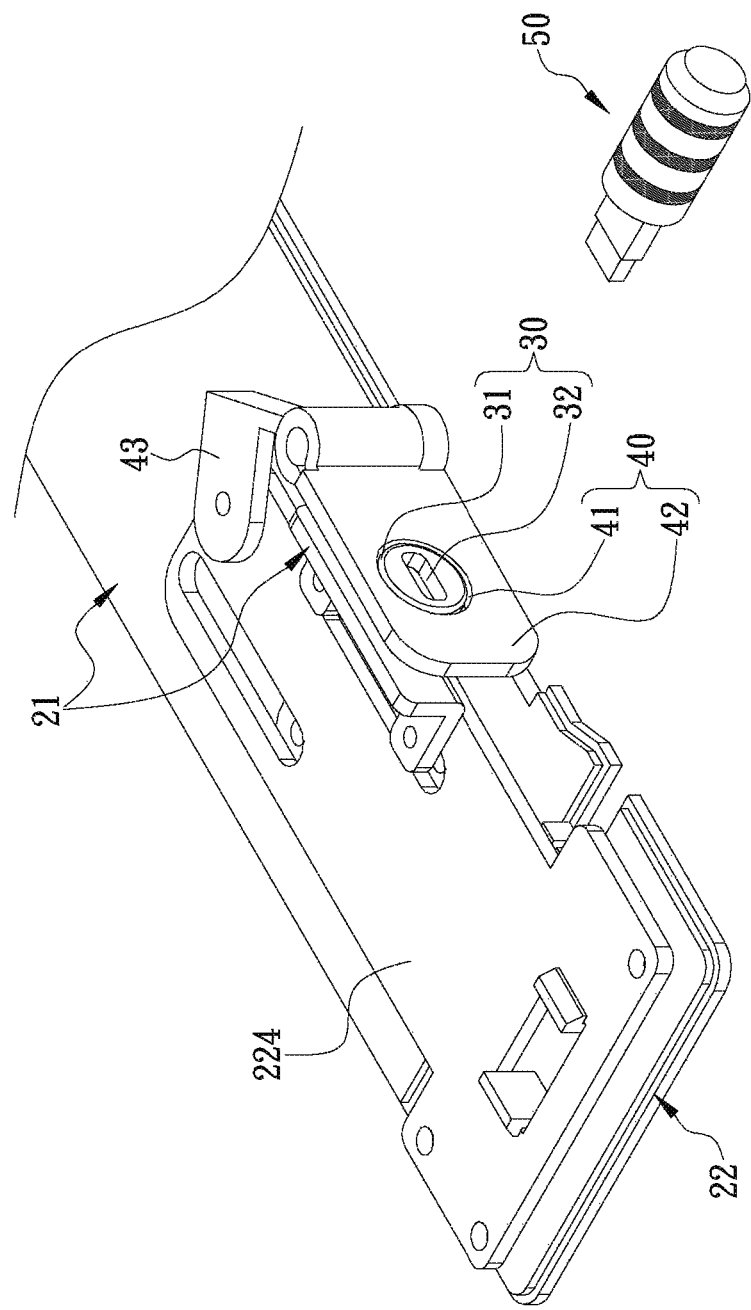
FIG. 5 shows the first fastener and the second fastener in FIG. 4 fastened together.

Once the fasteners are locked, referring to FIG. 2 and FIG. 5, the portable electronic device is in a locked state and is prevented from being detached from the docking station 20 because the signal plug 213 and the audio plug 223 are respectively inserted in the corresponding signal socket and the corresponding audio socket in the two corresponding lateral sides of the portable electronic device. The locked state, therefore, serves to protect the portable electronic device in the docking station 20 from theft. However, as long as the second fastener 40 is not fastened with the first fastener 30, meaning the sliding base 22 can be moved with respect to the positioning base 21, the portable electronic device is in a released state and can be detached from the docking station 20 at any time.

In the first preferred embodiment, referring back to FIG. 4 and FIG. 5, the first fastener 30 includes a first fastening member 31 and a locking hole 32. The locking hole 32 extends through the first fastening member 31 and is configured to be inserted by the locking element 50 to produce a locking effect. The second fastener 40 includes a second fastening member 41, a fastening hole 42, and a pivot arm 43. The fastening hole 42 extends through the second fastening member 41 and is configured to fasten with the first fastening member 31. The pivot arm 43 has one end connected to the second fastening member 41 at an angle greater than 90 degrees and also pivotally connected to the rear side of the positioning base 21. The other end (hereinafter the second end) of the pivot arm 43 is pivotally connected to the aforesaid end of the sliding base 22. Thus, by moving the sliding base 22, the second fastening member 41 is swayed. The sliding base 22 further includes a sliding plate 224 in order to be movable with respect to the positioning base 21. More specifically, one end of the sliding plate 224 is movably mounted in the positioning base 21 at a position adjacent to the second end of the positioning base 21 and is pivotally connected to the second end of the pivot arm 43, and the opposite end of the sliding plate 224 is fixed at the sliding base 22.

Figure 6:
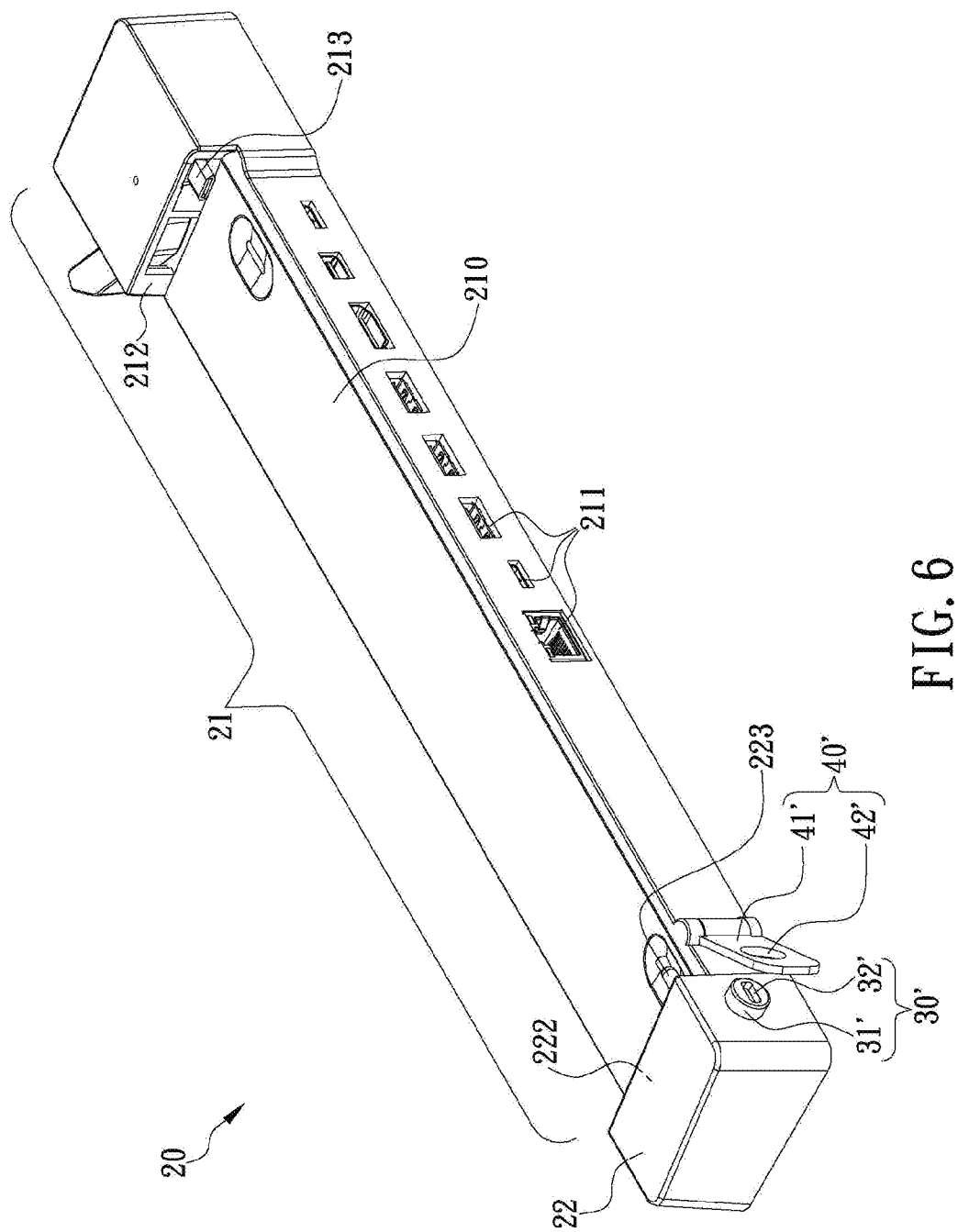
FIG. 6 is a rear perspective view of the docking station in the second preferred embodiment of the present invention.

In the second preferred embodiment of the present invention, referring to FIG. 6, a first fastener 30' is fixedly provided at the rear side of the sliding base 22 and includes a first fastening member 31' and a locking hole 32'. The locking hole 32' extends through the first fastening member 31' and is configured to be inserted by a locking element to produce a locking effect. A second fastener 40' is pivotally provided at the rear side of the positioning base 21 and includes a second fastening member 41' and a fastening hole 42'. The fastening hole 42' extends through the second fastening member 41' and is configured to fasten with the first fastening member 31'. When the first abutting surface 212 and the second abutting surface 222 abut against the two corresponding lateral sides of the portable electronic device respectively, the second fastener 40' can fasten with the first fastener 30' in order for the locking element to lock the two fasteners together, thereby preventing the sliding base 22 from moving with respect to the positioning base 21.

Figure 7:
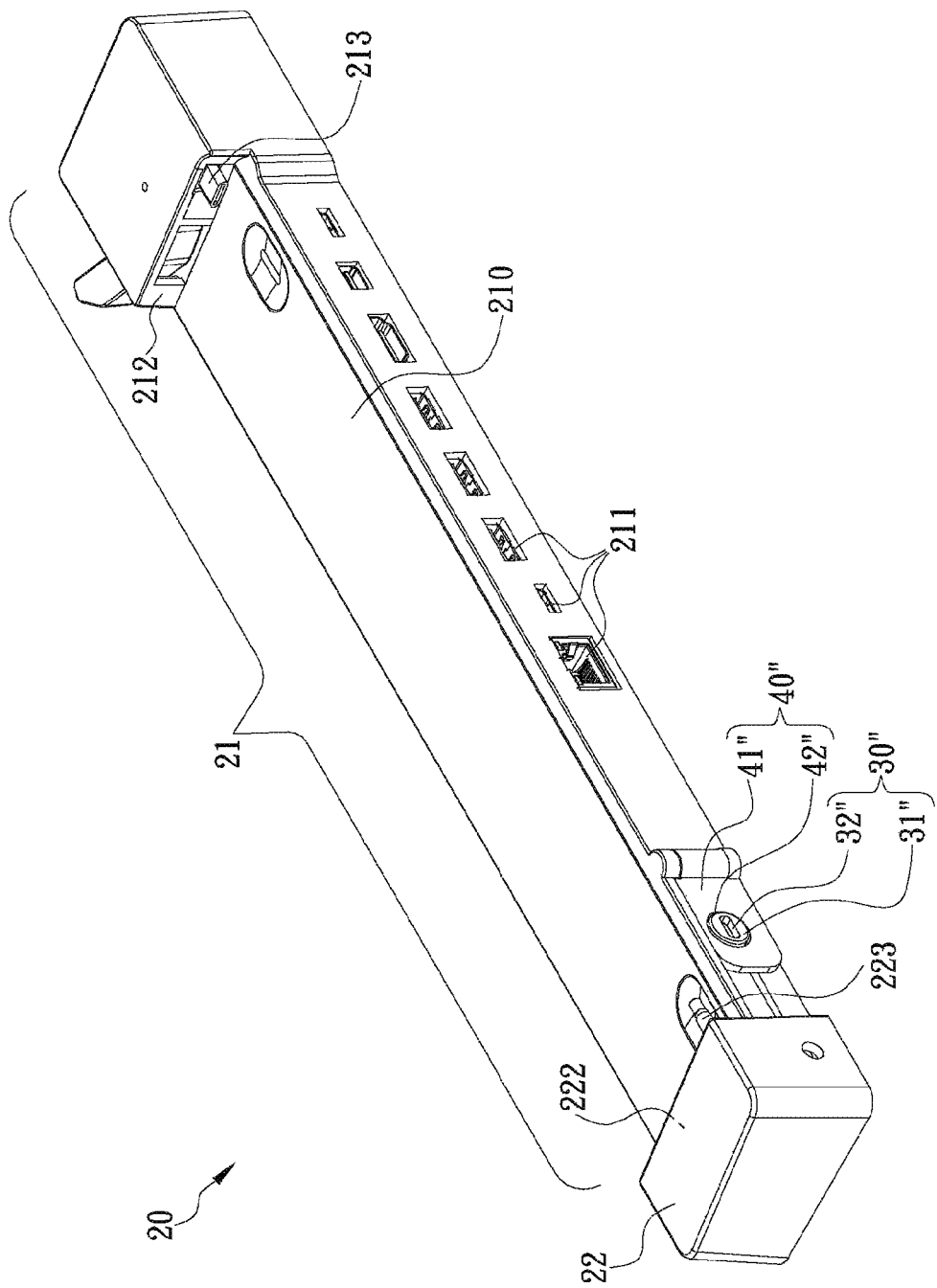
FIG. 7 is a rear perspective view of the docking station in the third preferred embodiment of the present invention.
Figure 8:
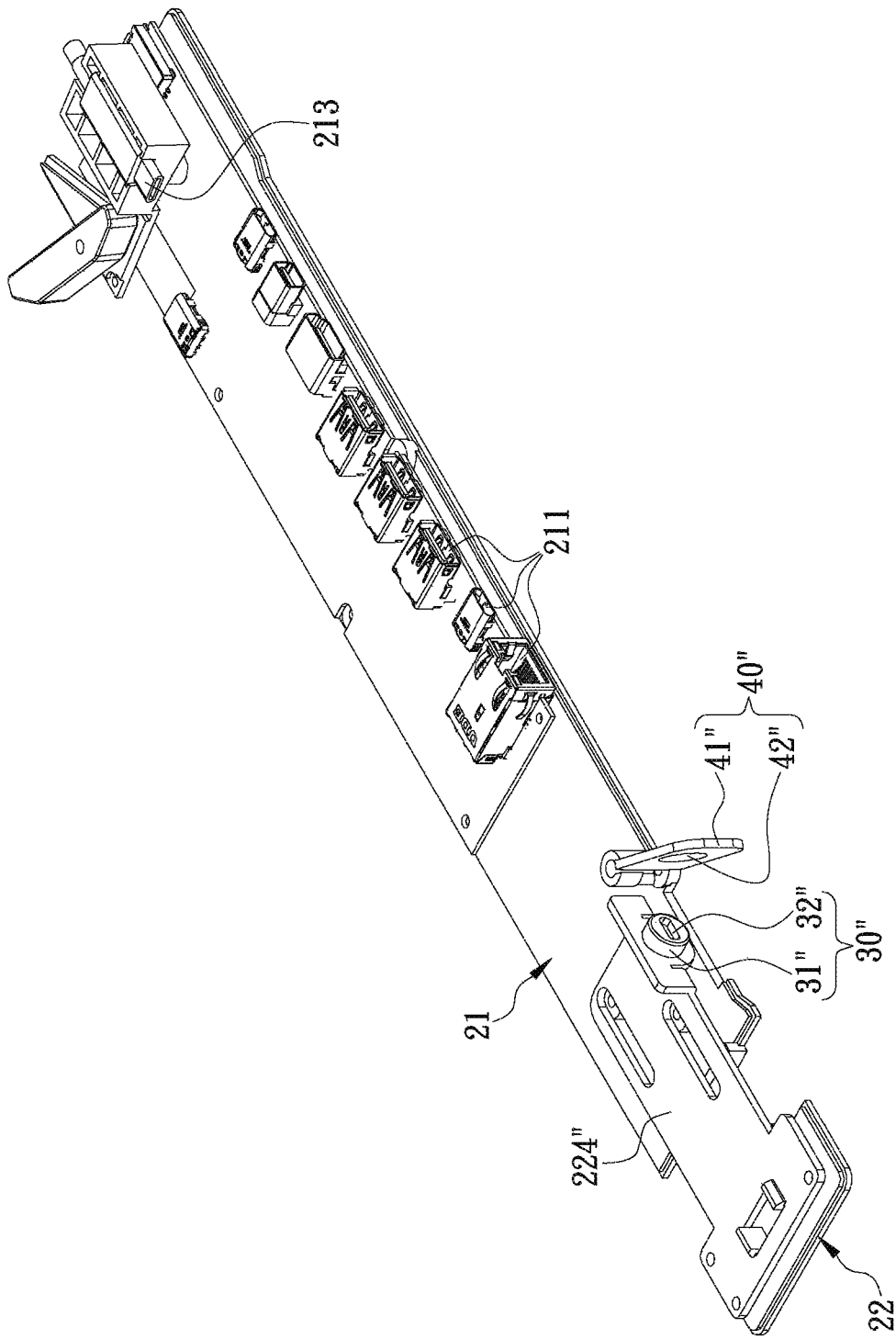
FIG. 8 shows the internal structure of the docking station in the third preferred embodiment.

In the third preferred embodiment of the present invention, referring to FIG. 7 and FIG. 8, a first fastener 30" is fixedly provided on a sliding plate 224" of the sliding base 22 at a position adjacent to one end of the sliding plate 224', is exposed at the rear side of the positioning base 21, and can move along with the sliding plate 224". The first fastener 30" includes a first fastening member 31" and a locking hole 32". The locking hole 32" extends through the first fastening member 31" and is configured to be inserted by a locking element to produce a locking effect. A second fastener 40" is pivotally provided at the rear side of the positioning base 21 and includes a second fastening member 41" and a fastening hole 42". The fastening hole 42" extends through the second fastening member 41" and is configured to fasten with the first fastening member 31". When the first abutting surface 212 and the second abutting surface 222 abut against the two corresponding lateral sides of the portable electronic device respectively, the second fastener 40" can fasten with the first fastener 30" in order for the locking element to lock the two fasteners together, thereby preventing the sliding base 22 from moving with respect to the positioning base 21.

While the invention herein disclosed has been described by means of specific embodiments, numerous modifications and variations could be made thereto by those skilled in the art without departing from the scope of the invention set forth in the claims.

What is claimed is:

1. A docking station with an anti-theft mechanism for a portable electronic device, comprising: a positioning base having: a bottom side configured to be placed flat on a flat surface; a top side concavely provided with a positioning space so that a portion of a bottom side of the portable electronic device that is adjacent to a rear edge of the portable electronic device is able to be positioned in the positioning space; a rear side provided with a plurality of expansion interfaces each configured to connect with a different peripheral; and a portion that is adjacent to a first end of the positioning base, faces the positioning space, and is provided with a first abutting surface, wherein the first abutting surface is protrudingly provided with a first plug extending toward the positioning space; a sliding base having one end connected to the positioning base at a position that is inside the positioning base and is adjacent to an opposite second end of the positioning base, the sliding base being movable with respect to the positioning base, the sliding base having a portion that faces the positioning space and is provided with a second abutting surface, wherein the second abutting surface corresponds to the first abutting surface and is protrudingly provided with a second plug extending toward the positioning space, and the first plug and the second plug are configured to be inserted into and thereby connected with corresponding sockets of the portable electronic device respectively; a first fastener fixed at the positioning base and exposed at the rear side of the positioning base; and a second fastener pivotally provided at the end of the sliding base and at the rear side of the positioning base, wherein when the first abutting surface and the second abutting surface abut against two corresponding lateral sides of the portable electronic device respectively, the second fastener is able to fasten with the first fastener so that the two fasteners are lockable with a locking element to prevent the sliding base from moving with respect to the positioning base; wherein the first fastener comprises a first fastening member and a locking hole; the locking hole extends through the first fastening member and is configured to be inserted by the locking element to produce a locking effect; the second fastener comprises a second fastening member, a fastening hole, and a pivot arm; the fastening hole extends through the second fastening member and is configured to fasten with the first fastening member; and the pivot arm has a first end not only connected to the second fastening member at an angle greater than 90 degrees but also pivotally connected to the rear side of the positioning base and has an opposite second end pivotally connected to the end of the sliding base in order for the sliding base to sway the second fastening member when moved.

2. The docking station of claim 1, wherein the sliding base further comprises a sliding plate, and the sliding plate has one end not only movably mounted in the positioning base at a position adjacent to the second end of the positioning base but also pivotally connected to the second end of the pivot arm and has an opposite end fixed at the sliding base in order for the sliding base to move with respect to the positioning base.

3. The docking station of claim 2, wherein one of the first plug and the second plug is a signal plug in order for the portable electronic device to electrically connect with and transmit signals to and from each said peripheral through the signal plug and a corresponding one of the expansion interfaces.

4. The docking station of claim 2, wherein one of the first plug and the second plug is a power plug in order for the portable electronic device to receive electricity from the docking station through the power plug.

5. The docking station of claim 2, wherein one of the first plug and the second plug is a power plug in order for the docking station to receive electricity from the portable electronic device through the power plug.

6. The docking station of claim 2, wherein one of the first plug and the second plug is a no-signal plug for securing the portable electronic device to the positioning base.

7. A docking station with an anti-theft mechanism for a portable electronic device, comprising: a positioning base having: a bottom side configured to be placed flat on a flat surface; a top side concavely provided with a positioning space so that a portion of a bottom side of the portable electronic device that is adjacent to a rear edge of the portable electronic device is able to be positioned in the positioning space; a rear side provided with a plurality of expansion interfaces each configured to connect with a different peripheral; and a portion that is adjacent to a first end of the positioning base, faces the positioning space, and is provided with a first abutting surface, wherein the first abutting surface is protrudingly provided with a first plug extending toward the positioning space; a sliding base having one end connected to the positioning base at a position that is inside the positioning base and is adjacent to an opposite second end of the positioning base, the sliding base being movable with respect to the positioning base, the sliding base having a portion that faces the positioning space and is provided with a second abutting surface, wherein the second abutting surface corresponds to the first abutting surface and is protrudingly provided with a second plug extending toward the positioning space, and the first plug and the second plug are configured to be inserted into and thereby connected with corresponding sockets of the portable electronic device respectively; a first fastener fixedly provided on the sliding base; and a second fastener pivotally provided at the rear side of the positioning base, wherein when the first abutting surface and the second abutting surface abut against two corresponding lateral sides of the portable electronic device respectively, the second fastener is able to fasten with the first fastener so that the two fasteners are lockable with a locking element to prevent the sliding base from moving with respect to the positioning base; wherein the first fastener is fixedly provided at a rear side of the sliding base and comprises a first fastening member and a locking hole, the locking hole extends through the first fastening member and is configured to be inserted by the locking element to produce a locking effect, the second fastener comprises a second fastening member and a fastening hole, and the fastening hole extends through the second fastening member and is configured to fasten with the first fastening member.

8. The docking station of claim 7, wherein the sliding base further comprises a sliding plate, the sliding plate has a first end movably mounted in the positioning base at a position adjacent to the second end of the positioning base and has an opposite second end fixed at the sliding base, and the first fastener is fixedly provided on the sliding plate at a position adjacent to the first end of the sliding plate, is exposed at the rear side of the positioning base, and is movable with the sliding plate.

9. The docking station of claim 8, wherein one of the first plug and the second plug is a signal plug in order for the portable electronic device to electrically connect with and transmit signals to and from each said peripheral through the signal plug and a corresponding one of the expansion interfaces.

10. The docking station of claim 8, wherein one of the first plug and the second plug is a power plug in order for the portable electronic device to receive electricity from the docking station through the power plug.

11. The docking station of claim 8, wherein one of the first plug and the second plug is a power plug in order for the docking station to receive electricity from the portable electronic device through the power plug.

12. The docking station of claim 8, wherein one of the first plug and the second plug is a no-signal plug for securing the portable electronic device to the positioning base.

* * * * *